US012696726B2

(12) United States Patent
Okuno et al.

(10) Patent No.: US 12,696,726 B2
(45) Date of Patent: Jul. 28, 2026

(54) LAMINATE AND RELEASE AGENT COMPOSITION

(71) Applicant: NISSAN CHEMICAL CORPORATION, Tokyo (JP)

(72) Inventors: Takahisa Okuno, Toyama (JP); Yuki Usui, Toyama (JP); Hiroto Ogata, Toyama (JP); Shunsuke Moriya, Toyama (JP); Masaki Yanai, Toyama (JP); Tetsuya Shinjo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 478 days.

(21) Appl. No.: 18/023,184

(22) PCT Filed: Aug. 20, 2021

(86) PCT No.: PCT/JP2021/030673

§ 371 (c)(1),
(2) Date: Feb. 24, 2023

(87) PCT Pub. No.: WO2022/045026

PCT Pub. Date: Mar. 3, 2022

(65) Prior Publication Data

US 2023/0343629 A1 Oct. 26, 2023

(30) Foreign Application Priority Data

Aug. 27, 2020 (JP) ................................ 2020-143934

(51) Int. Cl.
*H10P 72/70* (2026.01)
*C09J 7/40* (2018.01)
*C09J 183/04* (2006.01)

(52) U.S. Cl.
CPC .............. *H10P 72/74* (2026.01); *C09J 7/405* (2018.01); *C09J 183/04* (2013.01); *C09J 2203/326* (2013.01); *C09J 2301/312* (2020.08); *H10P 72/7416* (2026.01); *H10P 72/7444* (2026.01)

(58) Field of Classification Search
CPC ...... H01L 21/6835; C09J 7/405; C09J 183/04
See application file for complete search history.

(56) References Cited

U.S. PATENT DOCUMENTS

2012/0329249 A1 12/2012 Ahn et al.
2013/0029145 A1 1/2013 Kato et al.
2014/0210075 A1 7/2014 Lee et al.
2015/0274971 A1* 10/2015 Endo .......................... C09J 7/35 156/60
2017/0172886 A1* 6/2017 Osborne .............. A61K 8/9789
2017/0190939 A1 7/2017 Hori et al.
2018/0037013 A1* 2/2018 Endo ...................... C09J 183/04
2018/0094178 A1 4/2018 Yamamoto et al.
2019/0027391 A1* 1/2019 Tagami ............... H01L 21/6836

FOREIGN PATENT DOCUMENTS

| | | | |
|---|---|---|---|
| CN | 106574168 | A | 4/2017 |
| CN | 107406750 | A | 11/2017 |
| JP | 2004-064040 | | 2/2004 |
| JP | 2012-069783 | | 4/2012 |
| JP | 2012-106486 | | 6/2012 |
| JP | 2013-179135 | | 9/2013 |
| JP | 2014-146793 | | 8/2014 |
| TW | 201329185 | A1 | 7/2013 |
| WO | 2012/118700 | | 9/2012 |
| WO | 2015/190438 | | 12/2015 |
| WO | 2016/163219 | A1 | 10/2016 |
| WO | 2017/221772 | | 12/2017 |
| WO | 2018/083964 | | 5/2018 |
| WO | 2019/212008 | A1 | 11/2019 |

OTHER PUBLICATIONS

International Search Report issued in International Pat. Appl. No. PCT/JP2021/030673, dated Nov. 2, 2021, along with an English translation thereof.
Extended European Search Report that issued in corresponding European Patent Application No. 21861452.7, dated Sep. 10, 2024.
Office Action that issued in Taiwanese Patent Application No. 110131318, dated Sep. 23, 2024, along with English translation thereof.
Office Action that issued in corresponding Chinese Patent Application No. 202180052586.4, dated Apr. 18, 2025, along with English translation thereof.

* cited by examiner

*Primary Examiner* — Brian Turner
(74) *Attorney, Agent, or Firm* — Greenblum & Bernstein, P.L.C.

(57) ABSTRACT

The laminate of the invention has a semiconductor substrate, a support substrate, a release layer disposed so as to come into contact with the semiconductor substrate, and an adhesive layer disposed between the support substrate and the release layer, characterized in that the release layer is a film formed from a releasing agent composition containing a polyorganosiloxane component essentially containing polydimethylsiloxane; the polyorganosiloxane component has a viscosity of $5.50\times10^3$ Pa·s to $0.75\times10^3$ Pa·s, as measured at 25° C.; and the film has a thickness of 0.01 μm to 4.90 μm.

18 Claims, No Drawings

LAMINATE AND RELEASE AGENT COMPOSITION

TECHNICAL FIELD

The present invention relates to a laminate and to a releasing agent composition.

BACKGROUND ART

Conventionally, electronic elements and wires are 2-dimensionally (within a plane) integrated on a semiconductor wafer. In a trend toward further integration, demand has arisen for a semiconductor integration technique which achieves 3-dimensional integration (i.e., stacking) in addition to 2-dimensional integration. In the technique of 3-dimensional integration, a number of layers are stacked with wire connection by the mediation of through silicon vias (TSVs). In integration of multiple layers, each component wafer to be stacked is thinned by polishing (i.e., grinding) a surface opposite the circuit-furnished surface (i.e., a back surface), and the thus-thinned semiconductor wafers are stacked.

Before thinning, the semiconductor wafer (may also be called simply "wafer") is fixed to a support for facilitating polishing by means of a polishing machine (i.e., grinder). Since the fixation must be easily removed after polishing, the fixation is called temporary bonding. Temporary bonding must be easily removed from the support. When such temporary bonding is removed by excessive force, in some cases a thinned semiconductor wafer may be broken or deformed. In order to prevent such a phenomenon, the temporarily bonded support is detached in a gentle manner. However, from another aspect, it is not preferred that the temporarily bonded support be removed or slid by a stress applied during polishing of the back surface of the semiconductor wafer. Therefore, temporary bonding must withstand the stress during polishing and must be easily removed after polishing.

Under such circumstances, one required performance includes having high stress (i.e., strong adhesion) within the plane during polishing and low stress (i.e., weak adhesion) toward the thickness direction during detachment (see, for example, Patent Documents 1 and 2).

Meanwhile, electrical connection between a semiconductor wafer and semiconductor chips is accomplished by the mediation of bump balls made of, for example, a metallic conductive material. By use of semiconductor chips having such bump balls, the size of a semiconductor package can be reduced.

However, bump balls, which are generally formed from a metal such as a solder, cannot withstand a load (e.g., pressure), and may be deformed by a mechanical load applied during, for example, a joining step of a semiconductor device production process (see, for example, Patent Document 3).

In a recent development in the semiconductor field involving the aforementioned problem, there is increasing demand for a technique for suppressing deformation of bump balls, which would otherwise be caused by a mechanical load (e.g., pressure) in a semiconductor device production process.

PRIOR ART DOCUMENTS

Patent Documents

Patent Document 1: Japanese Patent Application Laid-Open (kokai) No. 2004-64040

Patent Document 2: Japanese Patent Application Laid-Open (kokai) No. 2012-106486

Patent Document 3: WO 2018/083964

Patent Document 4: Japanese Patent Application Laid-Open (kokai) No. 2013-179135

Patent Document 5: US Patent Application No. 2012/0329249

Patent Document 6: WO 2012/118700

Patent Document 7: Japanese Patent Application Laid-Open (kokai) No. 2014-146793

Patent Document 8: WO 2015/190438

SUMMARY OF THE INVENTION

Problems to be Solved by the Invention

The present invention has been conceived under such circumstances. Thus, an object of the present invention is to provide a laminate having a release layer which exhibits excellent heat resistance during joining of a semiconductor substrate to a support substrate, processing of the back surface of the semiconductor substrate, or a like process; and which can suppress damage of a semiconductor substrate due to a mechanical load (e.g., pressure) in production of semiconductor devices and other processes. Another object of the present invention is to provide a releasing agent composition which provides a film suitably serving as such a release layer.

Means for Solving the Problems

The present inventors have conducted extensive studies for solving the problems, and have found that the above objects can be attained by a laminate having a semiconductor substrate, a support substrate, a release layer disposed so as to come into contact with the semiconductor substrate, and an adhesive layer disposed between the support substrate and the release layer, wherein the release layer is a film formed from a releasing agent composition containing a polyorganosiloxane component comprising polydimethylsiloxane; the polyorganosiloxane component has a viscosity of a specific value; and the film has a thickness falling within a specific range. The present invention has been accomplished on the basis of this finding.

Notably, Patent Documents 4 to 8 disclose various techniques relating to wafer processed products, a substrate processing method, a laminate formed by use of a temporary adhesive, and the like. However, all the above documents fail to specifically disclose the combination of the ranges of viscosity and film thickness according to the present invention, and advantageous effects exerted by the characteristic feature of the invention.

Accordingly, the present invention provides the following.

1. A laminate comprising a semiconductor substrate, a support substrate, a release layer disposed so as to come into contact with the semiconductor substrate, and an adhesive layer disposed between the support substrate and the release layer, characterized in that the release layer is a film formed from a releasing agent composition containing a polyorganosiloxane component comprising polydimethylsiloxane;

the polyorganosiloxane component has a viscosity of $5.50\times10^3$ Pa·s to $0.75\times10^3$ Pa·s, as measured at 25° C.; and the film has a thickness of 0.01 μm to 4.90 μm.

2. A laminate according to 1 above, wherein the viscosity of the polyorganosiloxane component is $5.00\times10^3$ Pa·s to $0.80\times10^3$ Pa·s, as measured at 25° C.
3. A laminate according to 2 above, wherein the viscosity of the polyorganosiloxane component is $4.52\times10^3$ Pa·s to $0.96\times10^3$ Pa·s, as measured at 25° C.
4. A laminate according to any of 1 to 3 above, wherein the thickness of the film is 0.25 μm to 3.75 μm.
5. A laminate according to 4 above, wherein the thickness of the film is 1.75 μm to 2.75 μm.
6. A laminate according to any of 1 to 5 above, wherein the adhesive layer is disposed so as to come into contact with the support substrate and the release layer.
7. A laminate according to any of 1 to 6 above, wherein the adhesive layer is a film formed from an adhesive composition containing an adhesive component (S) containing at least one species selected from among a polyorganosiloxane adhesive, an acrylic resin adhesive, an epoxy resin adhesive, a polyamide adhesive, a polystyrene adhesive, a polyimide adhesive, and a phenolic resin adhesive.
8. A laminate according to 7 above, wherein the adhesive component (S) contains a polysiloxane adhesive.
9. A laminate according to 8 above, wherein the polyorganosiloxane adhesive contains a polyorganosiloxane component (A) which is curable through hydrosilylation.
10. A releasing agent composition for forming a release layer included in a laminate, the laminate comprising a semiconductor substrate, a support substrate, the release layer disposed so as to come into contact with the semiconductor substrate, and an adhesive layer disposed between the support substrate and the release layer, and the release layer being a film having a thickness of 0.01 μm to 4.90 μm, wherein the composition contains a polyorganosiloxane component comprising polydimethylsiloxane, and the polyorganosiloxane component has a viscosity of $5.50\times10^3$ Pa·s to $0.75\times10^3$ Pa·s, as measured at 25° C.
11. A releasing agent composition according to 10 above, wherein the viscosity of the polyorganosiloxane component is $5.00\times10^3$ Pa·s to $0.80\times10^3$ Pa·s, as measured at 25° C.
12. A releasing agent composition according to 11 above, wherein the viscosity of the polyorganosiloxane component is $4.52\times10^3$ Pa·s to $0.96\times10^3$ Pa·s, as measured at 25° C.
13. A releasing agent composition according to any of 10 to 12 above, wherein the thickness of the film is 0.25 μm to 3.75 μm.
14. A releasing agent composition according to 13 above, wherein the thickness of the film is 1.75 μm to 2.75 μm.
15. A releasing agent composition according to any of 10 to 14 above, wherein the adhesive layer is disposed so as to come into contact with the support substrate and the release layer.
16. A releasing agent composition according to any of 10 to 15 above, wherein the adhesive layer is a film formed from an adhesive composition containing an adhesive component (S) containing at least one species selected from among a polyorganosiloxane adhesive, an acrylic resin adhesive, an epoxy resin adhesive, a polyamide adhesive, a polystyrene adhesive, a polyimide adhesive, and a phenolic resin adhesive.
17. A releasing agent composition according to 16 above, wherein the adhesive component (S) contains a polyorganosiloxane adhesive.
18. A releasing agent composition according to 17 above, wherein the polyorganosiloxane adhesive contains a polyorganosiloxane component (A) which is curable through hydrosilylation.

Effects of the Invention

The laminate of the present invention has a semiconductor substrate, a support substrate, a release layer disposed so as to come into contact with the semiconductor substrate, and an adhesive layer disposed between the support substrate and the release layer. The release layer is a film formed from a releasing agent composition containing a polyorganosiloxane component comprising polydimethylsiloxane (i.e., a thermoplastic polymer having excellent heat resistance). Also, the viscosity (25° C.) of the polyorganosiloxane component is regulated to fall within a specific range, and the thickness of the film is regulated to fall within a specific range. Thus, the laminate exhibits excellent heat resistance, and damage of the semiconductor substrate (i.e., deformation of bumps of the semiconductor substrate) due to an external mechanical load (e.g., pressure) is suppressed.

By use of the laminate of the present invention having the aforementioned properties, more reliable production of semiconductor elements can be expected.

Notably, there will next be described a conceivable reason for achievement of the effects of the present invention by regulating the viscosity and film thickness to fall within the specific ranges according to the present invention.

Firstly, when the release layer is excessively thin, the protective function of the release layer for reducing the damage of the semiconductor substrate decreases, whereas when the release layer is excessively thick, the protective function also decreases due to high flowability of the release layer. Secondary, when the viscosity of the polyorganosiloxane component is excessively low, the protective function decreases due to high flowability of the release layer, whereas when the viscosity of the polyorganosiloxane component is excessively high, the close adhesion of the release layer with respect to the substrate or an adjacent functional layer (e.g., an adhesive layer) is disadvantageously reduced to facilitate interlayer delamination, resulting in a decrease in protective function. Under the aforementioned conditions, the advantageous effects of the invention are conceivably attained by using polydimethylsiloxane, which provides high heat resistance and debondability, as the polyorganosiloxane component forming the film, and by regulating the viscosity of the component and also the thickness of the formed film to fall within specific ranges.

MODES FOR CARRYING OUT THE INVENTION

The laminate of the present invention has a semiconductor substrate, a support substrate, a release layer disposed so as to come into contact with the semiconductor substrate, and an adhesive layer disposed between the support substrate and the release layer, wherein the release layer is a film formed from a releasing agent composition containing a polyorganosiloxane component comprising polydimethylsiloxane; the polyorganosiloxane component has a viscosity of $5.50\times10^3$ Pa·s to $0.75\times10^3$ Pa·s, as measured at 25° C.; and the film has a thickness of 0.01 μm to 4.90 μm.

In a preferred embodiment, the laminate of the present invention has a semiconductor substrate, a support substrate, a release layer disposed so as to come into contact with the semiconductor substrate, and an adhesive layer disposed so as to come into contact with the support substrate and the release layer.

The semiconductor substrate is, for example, a wafer having a circuit-surface and a backside surface to be processed. No particular limitation is imposed on the semiconductor substrate, and a specific example thereof is a silicon wafer having a diameter of about 300 mm and a thickness of about 770 μm.

Particularly, according to the present invention, even when functional parts; i.e., electrical joining parts such as electrodes or terminals (e.g., bumps and pillars) are mounted on the semiconductor substrate, damage of the functional parts due to heat or pressure can be avoided or suppressed, by virtue of the release layer disposed so as to be in contact with the semiconductor substrate.

Specific examples of the semiconductor substrate provided with bumps include silicon wafers having bumps such as a ball bump, a printed bump, a stud bump, and a plating bump. Generally, the bump height, bump diameter, and bump pitch are appropriately selected from about 1 to about 200 μm, 1 μm to 200 μm, and 1 μm to 500 μm, respectively.

Specific examples of plating bumps include, but are not limited to, Sn-base alloy plating bumps such as an Sn—Ag bump, an Sn—Bi bump, an Sn bump, and an Au—Sn bump.

Examples of the pillar material of the semiconductor substrate provided with pillars include, but are not limited to, Sn-base alloy pillars, copper pillars, and copper alloy pillars.

The support substrate is a support (carrier) for sustaining the semiconductor substrate. Specific examples thereof include, but are not limited to, a glass wafer having a diameter of about 300 mm and a thickness of about 700 μm.

As described above, the release layer included in the laminate of the present invention is a film formed from a releasing agent composition containing a polyorganosiloxane component comprising polydimethylsiloxane. The viscosity of the polyorganosiloxane component is $5.50\times10^3$ Pa·s to $0.75\times10^3$ Pa·s, as measured at 25° C.; and the film thickness is 0.01 μm to 4.90 μm.

From the viewpoint of suppressing, at high reproducibility, damage of the semiconductor substrate (i.e., deformation of bumps of the semiconductor substrate) due to an external load (e.g., pressure or temperature), the upper limit of the viscosity is preferably $5.00\times10^3$ Pa·s, more preferably $4.52\times10^3$ Pa·s, and the lower limit of the viscosity is preferably $0.80\times10^3$ Pa·s, more preferably $0.96\times10^3$ Pa·s. In addition, from the viewpoint of producing, at high reproducibility, a laminate which can achieve easy separation of a substrate even after application of an external load (i.e., a load attributed to pressure or temperature), the upper limit of the viscosity is still more preferably $4.02\times10^3$ Pa·s, yet more preferably $3.50\times10^3$ Pa·s, and the lower limit of the viscosity is still more preferably $0.98\times10^3$ Pa·s, yet more preferably $1.00\times10^3$ Pa·s.

Notably, in the present invention, the viscosity of polyorganosiloxane component may be determined by means of a rheometer such as Rheometer MCR302 (product of Anton Paar Japan K.K.).

From the viewpoint of suppressing, at high reproducibility, damage of the semiconductor substrate (i.e., deformation of bumps of the semiconductor substrate) due to an external load (e.g., pressure or temperature), the upper limit of the film thickness is preferably 3.75 μm, more preferably 2.75 μm, and the lower limit of the film thickness is preferably 0.25 μm, more preferably 1.75 μm. In addition, from the viewpoint of producing, at high reproducibility, a laminate which can achieve easy separation of a substrate even after application of an external load (i.e., a load attributed to pressure or temperature), the upper limit of the film thickness is still more preferably 2.70 μm, yet more preferably 2.65 μm, and the lower limit of the film thickness is still more preferably 1.80 μm, yet more preferably 1.85 μm.

The polydimethylsiloxane employed in the present invention is represented by formula (X) below. Note that the invention does not exclude a polydimethylsiloxane including a small amount of a group (i.e., an impurity structural unit) other than $—Si(CH_3)_3$ group or $—Si(CH_3)_2—O—$ group at an end or among the entire repeating units of the polydimethylsiloxane.

[F1]

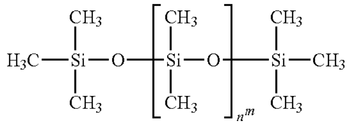

(X)

($n^m$ is a positive integer and represents the number of repeating units).

As mentioned above, the releasing agent composition contains a polyorganosiloxane component comprising polydimethylsiloxane. Thus, the polyorganosiloxane component essentially contains polydimethylsiloxane. However, the invention does not exclude the presence of a polyorganosiloxane other than polydimethylsiloxane in the polydimethylsiloxane employed in the present invention.

Under such circumstances, the purity of the polydimethylsiloxane employed in the present invention cannot unequivocally be determined, since the purity varies depending on the molecular weight and polydispersity, the purity of starting material employed, and the synthesis method employed. Generally, the purity is 99% or higher.

The weight-average molecular weight of the polydimethylsiloxane employed in the present invention is generally 100,000 to 2,000,000, and the polydispersity is generally 1.0 to 10.0.

The polyorganosiloxane component employed in the present invention is composed of one or more polydimethylsiloxanes having a weight-average molecular weight and polydispersity falling within the aforementioned ranges. The polydimethylsiloxane(s) is/are appropriately selected so as to meet the aforementioned conditions of viscosity.

Notably, the weight-average molecular weight, number average molecular weight, and polydispersity of the polyorganosiloxane such as polydimethylsiloxane may be determined by means of, for example, a GPC apparatus (EcoSEC, HLC-8320GPC, product of Tosoh Corporation) and GPC columns (TSKgel SuperMultiporeHZ-N and TSKgel SuperMultiporeHZ-H, products of Tosoh Corporation) at a column temperature of 40° C. and a flow rate of 0.35 mL/min by use of tetrahydrofuran as an eluent (elution solvent) and polystyrene (product of Sigma-Aldrich) as a standard substance.

The releasing agent composition may contain a solvent.

No particular limitation is imposed on the solvent, so long as it can dissolve, for example, the polyorganosiloxane component. Specific example of such a good solvent include linear-chain or branched-chain aliphatic hydrocarbons, for example, linear-chain or branched-chain saturated aliphatic hydrocarbons such as hexane, heptane, octane, nonane, decane, undecane, dodecane, and isododecane; alicyclic hydrocarbons, for example, saturated alicyclic hydrocarbons such as cyclohexane, cycloheptane, cyclooctane, isopropylcyclohexane, and p-menthane, and unsaturated alicyclic hydrocarbons such as limonene; aromatic hydrocarbons such as benzene, toluene, o-xylene, m-xylene, p-xylene, mesitylene, 1,2,4-trimethylbenzene, cumene, 1,4-diisopropylbenzene, and p-cymene; ketones, for example, saturated aliphatic hydrocarbon ketones, such as dialkyl ketones such as MIBK (methyl isobutyl ketone), ethyl methyl ketone, acetone, diisobutyl ketone, 2-octanone, 2-nonanone, and 5-nonanone, and cycloalkyl ketones such as cyclohexanone, and unsaturated aliphatic hydrocarbon ketones, such as alkenyl ketones such as isophorone; ethers, for example, dialkyl ethers such as diethyl ether, di(n-propyl) ether, di(n-butyl) ether, and di(n-pentyl) ether, and cyclic alkyl ethers such as tetrahydrofuran and dioxane; sulfides, for example, dialkyl sulfides such as diethyl sulfide, di(n-propyl) sulfide, and di(n-butyl) sulfide; amides such as N,N-dimethylformamide, N,N-dimethylacetamide, N,N-dimethylisobutylamide, N-methylpyrrolidone, and 1,3-dimethyl-2-imidazolidinone; nitriles such as acetonitrile and 3-methoxypropionitrile; glycol monohydrocarbon ethers, for example, glycol monoalkyl ethers such as propylene glycol monomethyl ether, diethylene glycol monomethyl ether, triethylene glycol monomethyl ether, and dipropylene glycol monomethyl ether, and glycol monoaryl ethers such as diethylene glycol monophenyl ether; alkyl alcohols, for example, cyclic alkyl alcohols such as cyclohexanol, and monoalcohols other than alkyl alcohols such as diacetone alcohol, benzyl alcohol, 2-phenoxyethanol, 2-benzyloxyethanol, 3-phenoxybenzyl alcohol, and tetrahydrofurfuryl alcohol; glycol monoethers, for example, glycol monoalkyl ethers such as ethylene glycol monohexyl ether, propylene glycol monobutyl ether, diethylene glycol monoethyl ether, dipropylene glycol monobutyl ether, ethylene glycol monobutyl ether, diethylene glycol monobutyl ether, diethylene glycol monoisobutyl ether, dipropylene glycol monomethyl ether, diethylene glycol monopropyl ether (propyl carbitol), diethylene glycol monohexyl ether, 2-ethylhexyl carbitol, dipropylene glycol monopropyl ether, tripropylene glycol monomethyl ether, diethylene glycol monomethyl ether, and tripropylene glycol monobutyl ether, and glycol monoaryl ethers such as 2-phenoxyethanol; glycol diethers, for example, glycol dialkyl ethers such as ethylene glycol dibutyl ether, diethylene glycol dimethyl ether, diethylene glycol diethyl ether, propylene glycol dibutyl ether, dipropylene glycol methyl n-propyl ether, dipropylene glycol dimethyl ether, dipropylene glycol diethyl ether, dipropylene glycol dibutyl ether, triethylene glycol dimethyl ether, triethylene glycol butyl methyl ether, and tetraethylene glycol dimethyl ether; glycol ether acetates, for example, glycol monoalkyl ether acetates such as dipropylene glycol monomethyl ether acetate, diethylene glycol monoethyl ether acetate, diethylene glycol monobutyl ether acetate, and propylene glycol monomethyl ether acetate; cyclic carbonates such as ethylene carbonate, propylene carbonate, and vinylene carbonate; and esters such as butyl acetate and pentyl acetate. These solvents may be used singly or in combination of two or more species.

Also, so long as the polyorganosiloxane component is not deposited, the releasing agent composition may further contain one or more poor solvents along with the good solvent, for the purpose of controlling the viscosity or surface tension of the composition and other reasons. Specific examples of such poor solvents include polyhydric alcohols such as ethylene glycol, diethylene glycol, triethylene glycol, dipropylene glycol, 1,3-butanediol, and 2,3-butanediol; linear-chain or branched-chain alkyl monoalcohols such as methanol, ethanol, and propanol; and glycols such as ethylene glycol, propylene glycol, diethylene glycol, dipropylene glycol, tripropylene glycol, hexylene glycol, triethylene glycol, 1,2-butanediol, 2,3-butanediol, 1,3-butanediol, 1,4-butanediol, and 1,5-pentanediol.

When the releasing agent composition contains solvent, the amount of the solvent may be generally adjusted to 70 mass % to 99.9 mass %, with respect to the entire composition. Thus, the amount of the polyorganosiloxane component essentially formed of polydimethylsiloxane is 0.1 mass % to 30 mass %, with respect to the entire composition.

So long as the effects of the present invention are not impaired, the releasing agent composition may further contain an additional component other than solvent and the polyorganosiloxane component essentially formed of polydimethylsiloxane. However, from the viewpoints of providing a highly uniform film at high reproducibility, avoiding cumbersome steps in preparation of the composition, etc., the releasing agent composition consists of solvent and the polyorganosiloxane component essentially formed of polydimethylsiloxane.

The releasing agent composition may be produced by, for example, mixing the polyorganosiloxane component with a solvent.

No particular limitation is imposed on the sequential order of mixing. One possible example of the production method which can easily provide a releasing agent composition at high reproducibility includes dissolving the polyorganosiloxane component in a solvent in a single step. Another possible example of the production method includes dissolving a part of the polyorganosiloxane component in a solvent, dissolving the remaining part of the component in another solvent, and mixing the two separately prepared solutions. However, the production method is not limited to the above examples. Notably, so long as the relevant components are not decomposed or denatured in preparation of the releasing agent composition, the mixture may be appropriately heated.

In the present invention, in order to remove foreign substances present in the releasing agent composition, the employed solvent and solution, etc. may be filtered through a sub-micrometer filter or the like in the course of production of the composition or after mixing all the components.

The present invention is also directed to the above-described releasing agent composition, and conditions (e.g., suitable conditions or production conditions) in relation to the composition are as described above. By use of the releasing agent composition of the present invention, a film suitably serving as a release layer which may be used in production of, for example, a semiconductor device can be produced at high reproducibility.

The release layer, which is a film formed from the releasing agent composition of the present invention, is composed of a polyorganosiloxane component comprising polydimethylsiloxane. Thus, the release layer is not a cured film, but a thermoplastic film. By use of such a thermoplastic film, damage of the semiconductor substrate can be effectively suppressed.

The adhesive layer included in the laminate of the present invention may be, for example, a film formed from an adhesive composition containing an adhesive component (S).

No particular limitation is imposed on the adhesive component (S), so long as the component is used in such a technical field. Examples of the adhesive component (S) include, but are not limited to, a polyorganosiloxane adhesive, an acrylic resin adhesive, an epoxy resin adhesive, a polyamide adhesive, a polystyrene adhesive, a polyimide adhesive, and a phenolic resin adhesive.

Among these adhesives, a polyorganosiloxane adhesive (i.e., a polyorganosiloxane component) is preferred as the adhesive component (S), since the polyorganosiloxane adhesive exhibits suitable bonding performance during processing of a wafer or the like, is suitably removed after the processing, and has excellent heat resistance, which properties ensure suitable service as the release layer.

In a preferred embodiment, the adhesive composition used in the present invention contains, as an adhesive component, a polyorganosiloxane component (A) which is curable through hydrosilylation. In a more preferred embodiment, the polyorganosiloxane component (A) which is curable through hydrosilylation contains a polysiloxane (A1) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T), and a platinum group metal catalyst (A2); wherein the polysiloxane (A1) contains a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T', and a polyorganosiloxane (a2) having one or more units selected from the group consisting of a siloxane unit represented by $SiO_2$ (unit Q"), a siloxane unit represented by $R^{1''}R^{2''}R^{3''}SiO_{1/2}$ (unit M"), a siloxane unit represented by $R^{4''}R^{5''}SiO_{2/2}$ (unit D"), and a siloxane unit represented by $R^{6''}SiO_{3/2}$ (unit T"), and at least one unit selected from the group consisting of unit M", unit D", and unit T".

Each of $R^1$ to $R^6$ is a group or an atom bonded to a silicon atom and represents an alkyl group, an alkenyl group, or a hydrogen atom.

Each of $R^{1'}$ to $R^{6'}$ is a group bonded to a silicon atom and represents an alkyl group or an alkenyl group, and at least one of $R^{1'}$ to $R^{6'}$ is an alkenyl group.

Each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom.

The alkyl group may be linear-chain, branched-chain, or cyclic. However, a linear-chain or branched-chain alkyl group is preferred. No particular limitation is imposed on the number of carbon atoms thereof, and the number of carbon atoms is generally 1 to 40, preferably 30 or less, more preferably 20 or less, still more preferably 10 or less.

Specific examples of the linear-chain or branched-chain alkyl group include, but are not limited to, methyl, ethyl, n-propyl, i-propyl, n-butyl, i-butyl, s-butyl, tert-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Of these, methyl is preferred.

Specific examples of the cyclic alkyl group include, but are not limited to, cycloalkyl groups such as cyclopropyl, cyclobutyl, 1-methyl-cyclopropyl, 2-methyl-cyclopropyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethyl-cyclopropyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-i-propyl-cyclopropyl, 2-i-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl, and 2-ethyl-3-methyl-cyclopropyl; and bicycloalkyl groups such as bicyclobutyl, bicyclopentyl, bicyclohexyl, bicycloheptyl, bicyclooctyl, bicyclononyl, and bicyclodecyl.

The alkenyl group may be linear-chain, branched-chain, or cyclic. No particular limitation is imposed on the number of carbon atoms thereof, and the number of carbon atoms is generally 2 to 40, preferably 30 or less, more preferably 20 or less, still more preferably 10 or less.

Specific examples of the alkenyl group include, but are not limited to, ethenyl, 1-propenyl, 2-propenyl, 1-methyl-1-ethenyl, 1-butenyl, 2-butenyl, 3-butenyl, 2-methyl-1-propenyl, 2-methyl-2-propenyl, 1-ethylethenyl, 1-methyl-1-propenyl, 1-methyl-2-propenyl, 1-pentenyl, 2-pentenyl, 3-pentenyl, 4-pentenyl, 1-n-propylethenyl, 1-methyl-1-butenyl, 1-methyl-2-butenyl, 1-methyl-3-butenyl, 2-ethyl-2-propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propylethenyl, 1,2-dimethyl-1-propenyl, 1,2-dimethyl-2-propenyl, 1-cyclopentenyl, 2-cyclopentenyl, 3-cyclopentenyl, 1-hexenyl, 2-hexenyl, 3-hexenyl, 4-hexenyl, 5-hexenyl, 1-methyl-1-pentenyl, 1-methyl-2-pentenyl, 1-methyl-3-pentenyl, 1-methyl-4-pentenyl, 1-n-butylethenyl, 2-methyl-1-pentenyl, 2-methyl-2-pentenyl, 2-methyl-3-pentenyl, 2-methyl-4-pentenyl, 2-n-propyl-2-propenyl, 3-methyl-1-pentenyl, 3-methyl-2-pentenyl, 3-methyl-3-pentenyl, 3-methyl-4-pentenyl, 3-ethyl-3-butenyl, 4-methyl-1-pentenyl, 4-methyl-2-pentenyl, 4-methyl-3-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1-methyl-2-ethyl-2-propenyl, 1-s-butylethenyl, 1,3-dimethyl-1-butenyl, 1,3-dimethyl-2-butenyl, 1,3-dimethyl-3-butenyl, 1-i-butylethenyl, 2,2-dimethyl-3-butenyl, 2,3-dimethyl-1-butenyl, 2,3-dimethyl-2-butenyl, 2,3-dimethyl-3-butenyl, 2-i-propyl-2-propenyl, 3,3-dimethyl-1-butenyl, 1-ethyl-1-butenyl, 1-ethyl-2-butenyl, 1-ethyl-3-butenyl, 1-n-propyl-1-propenyl, 1-n-propyl-2-propenyl, 2-ethyl-1-butenyl, 2-ethyl-2-butenyl, 2-ethyl-3-butenyl, 1,1,2-trimethyl-2-propenyl, 1-tert-butylethenyl, 1-methyl-1-ethyl-2-propenyl, 1-ethyl-2-methyl-1-propenyl, 1-ethyl-2-methyl-2-propenyl, 1-i-propyl-1-propenyl, 1-i-propyl-2-propenyl, 1-methyl-2-cyclopentenyl, 1-methyl-3-cyclopentenyl, 2-methyl-1-cyclopentenyl, 2-methyl-2-cyclopentenyl, 2-methyl-3-cyclopentenyl, 2-methyl-4-cyclopentenyl, 2-methyl-5-cyclopentenyl, 2-methylene-cyclopentyl, 3-methyl-1-cyclopentenyl, 3-methyl-2-cyclopentenyl, 3-methyl-3-cyclopentenyl, 3-methyl-4-cyclopentenyl, 3-methyl-5-cyclopentenyl, 3-methylene-cyclopentyl, 1-cyclohexenyl, 2-cyclohexenyl, and 3-cyclohexenyl. Of these, ethenyl and 2-propenyl are preferred.

As described above, the polysiloxane (A1) includes the polyorganosiloxane (a1) and the polyorganosiloxane (a2). In curing, the alkenyl group present in the polyorganosiloxane (a1) and the hydrogen atom (Si—H group) present in the polyorganosiloxane (a2) form a cross-linking structure through hydrosilylation in the presence of the platinum group metal catalyst (A2). As a result, a cured film is yielded.

The polyorganosiloxane (a1) has one or more units selected from the group consisting of unit Q', unit M', unit D', and unit T', and at least one unit selected from the group consisting of unit M', unit D', and unit T'. Two or more polyorganosiloxanes satisfying the above conditions may be used in combination as the polyorganosiloxane (a1).

Examples of preferred combinations of two or more units selected from the group consisting of unit Q', unit M', unit D', and unit T' include, but are not limited to, (unit Q' and unit M'), (unit D' and unit M'), (unit T' and unit M'), and (unit Q', unit T', and unit M').

In the case where the polyorganosiloxane (a1) includes two or more polyorganosiloxanes, examples of preferred combinations include, but are not limited to, (unit Q' and unit M')+(unit D' and unit M'); (unit T' and unit M')+(unit D' and unit M'); and (unit Q', unit T', and unit M')+(unit T' and unit M').

The polyorganosiloxane (a2) has one or more units selected from the group consisting of unit Q", unit M", unit D", and unit T", and at least one unit selected from the group consisting of unit M", unit D", and unit T". Two or more polyorganosiloxanes satisfying the above conditions may be used in combination as the polyorganosiloxane (a2).

Examples of preferred combinations of two or more units selected from the group consisting of unit Q", unit M", unit D", and unit T" include, but are not limited to, (unit M" and unit D"), (unit Q" and unit M"), and (unit Q", unit T", and unit M").

The polyorganosiloxane (a1) is formed of siloxane units in which an alkyl group and/or an alkenyl group is bonded to a silicon atom. The alkenyl group content of the entire substituents $R^{1'}$ to $R^{6'}$ is preferably 0.1 mol % to 50.0 mol %, more preferably 0.5 mol % to 30.0 mol %, and the remaining $R^{1'}$ to $R^{6'}$ may be alkyl groups.

The polyorganosiloxane (a2) is formed of siloxane units in which an alkyl group and/or a hydrogen atom is bonded to a silicon atom. The hydrogen atom content of the entire substituents or atoms $R^{1''}$ to $R^{6''}$ is preferably 0.1 mol % to 50.0 mol %, more preferably 10.0 mol % to 40.0 mol %, and the remaining $R^{1''}$ to $R^{6''}$ may be alkyl groups.

The polysiloxane (A1) includes the polyorganosiloxane (a1) and the polyorganosiloxane (a2). In one preferred embodiment of the present invention, the ratio by mole of alkenyl groups present in the polyorganosiloxane (a1) to hydrogen atoms forming Si—H bonds present in the polyorganosiloxane (a2) is 1.0:0.5 to 1.0:0.66.

The weight average molecular weight of each of the polyorganosiloxane (a1) and the polyorganosiloxane (a2) is generally 500 to 1,000,000. From the viewpoint of attaining the effects of the present invention at high reproducibility, the weight average molecular weight is preferably 5,000 to 50,000.

The viscosity of each of the polyorganosiloxane (a1) and the polyorganosiloxane (a2) is generally 10 to 1,000,000 (mP·s). From the viewpoint of attaining the effects of the present invention at high reproducibility, the viscosity is preferably 50 to 10,000 (mP·s). Notably, in the present invention, the viscosity is measured at 25° C. by means of an E-type rotational viscometer.

The polyorganosiloxane (a1) and the polyorganosiloxane (a2) react with each other via hydrosilylation, to thereby form a film. Thus, the curing mechanism differs from the mechanism of curing mediated by, for example, silanol groups. Therefore, neither of the siloxanes is required to have a silanol group or a functional group forming a silanol group through hydrolysis (e.g., an alkyloxy group).

In one preferred embodiment of the present invention, the adhesive component (S) contains the aforementioned polysiloxane (A1) and the platinum group metal catalyst (A2).

The platinum-based metallic catalyst is used to accelerate hydrosilylation between alkenyl groups of the polyorganosiloxane (a1) and Si—H groups of the polyorganosiloxane (a2).

Specific examples of the platinum-based metallic catalyst include, but are not limited to, platinum catalysts such as platinum black, platinum(II) chloride, chloroplatinic acid, a reaction product of chloroplatinic acid and a monohydric alcohol, a chloroplatinic acid-olefin complex, and platinum bis(acetoacetate).

Examples of the platinum-olefin complex include, but are not limited to, a complex of platinum with divinyltetramethyldisiloxane.

The amount of platinum group metal catalyst (A2) is generally 1.0 to 50.0 ppm, with respect to the total amount of polyorganosiloxane (a1) and polyorganosiloxane (a2).

In order to suppress progress of hydrosilylation, the polyorganosiloxane component (A) may contain a polymerization inhibitor (A3).

No particular limitation is imposed on the polymerization inhibitor, so long as it can suppress the progress of hydrosilylation. Specific examples of the polymerization inhibitor include alkynyl alcohols such as 1-ethynyl-1-cyclohexanol and 1,1-diphenyl-2-propyn-1-ol.

Generally, the amount of polymerization inhibitor with respect to the total amount of the polyorganosiloxane (a1) and the polyorganosiloxane (a2) is 1,000.0 ppm or more from the viewpoint of attaining the effect, and 10,000.0 ppm or less from the viewpoint of preventing excessive suppression of hydrosilylation.

The adhesive composition used in the present invention may contain a releasing agent component (B). Through incorporation of the releasing agent component (B) into the adhesive composition used in the present invention, the adhesive layer formed therefrom can be suitably peeled at high reproducibility.

A typical example of the releasing agent component (B) is a polyorganosiloxane. Specific examples of the polyorganosiloxane include, but are not limited to, an epoxy-group-containing polyorganosiloxane, a methyl-group-containing polyorganosiloxane, and a phenyl-group-containing polyorganosiloxane.

Examples of preferred polyorganosiloxanes (i.e., release agent component (B)) include, but are not limited to, an epoxy-group-containing polyorganosiloxane, a methyl-group-containing polyorganosiloxane, and a phenyl-group-containing polyorganosiloxane.

The polyorganosiloxane serving as the releasing agent component (B) generally has a weight average molecular weight of 100,000 to 2,000,000. The weight average molecular weight is preferably 200,000 to 1,200,000, more preferably 300,000 to 900,000, from the viewpoint of attaining the effects of the present invention at high reproducibility. The polyorganosiloxane generally has a polydispersity of 1.0 to 10.0. The polydispersity is preferably 1.5 to 5.0, more preferably 2.0 to 3.0, from the viewpoint of, for example, achieving suitable debonding at high reproducibility. Notably, the weight average molecular weight and the polydispersity may be measured through the aforementioned methods.

The polyorganosiloxane serving as the releasing agent component (B) generally has a viscosity of 1,000 to 2,000,000 $mm^2/s$. Notably, the viscosity of the polyorganosiloxane (i.e., the releasing agent component (B)) is a kinematic viscosity (unit: $cSt=mm^2/s$), which may also be calculated by dividing viscosity (mPa·s) by density ($g/cm^3$). Specifically, the value of kinematic viscosity may be obtained from the viscosity as measured at 25° C. an E-type rotary viscometer and the density and calculated by the equation: kinematic viscosity ($mm^2/s$)=viscosity (mPa·s)/density ($g/cm^3$).

The epoxy-group-containing polyorganosiloxane includes such a siloxane containing a siloxane unit represented by, for example, $R^{11}R^{12}SiO_{2/2}$ (unit $D^{10}$).

$R^{11}$ is a group bonded to a silicon atom and represents an alkyl group, and $R^{12}$ is a group bonded to a silicon atom and represents an epoxy group or an organic group containing an epoxy group. Specific examples of the alkyl group include those as exemplified above.

The epoxy group in the organic group containing an epoxy group may be an independent epoxy group which does not condense with another ring structure, or may be an epoxy group forming a condensed ring with another ring structure (e.g., a 1,2-epoxycyclohexyl group).

Specific examples of the organic group containing an epoxy group include, but are not limited to, 3-glycidoxypropyl and 2-(3,4-epoxycyclohexyl)ethyl.

In the present invention, examples of preferred epoxy-group-containing polyorganosiloxanes include, but are not limited to, epoxy-containing polydimethylsiloxane.

The epoxy-group-containing polyorganosiloxane contains the aforementioned siloxane unit (unit $D^{10}$), but may also contain the aforementioned unit Q, unit M and/or unit T, in addition to unit $D^{10}$.

In one preferred embodiment of the present invention, specific examples of the epoxy-group-containing polyorganosiloxane include polyorganosiloxane formed only of unit $D^{10}$, polyorganosiloxane formed of unit $D^{10}$ and unit Q, polyorganosiloxane formed of unit $D^{10}$ and unit M, polyorganosiloxane formed of unit $D^{10}$ and unit T, polyorganosiloxane formed of unit $D^{10}$, unit Q, and unit M, polyorganosiloxane formed of unit $D^{10}$, unit M, and unit T, and polyorganosiloxane formed of unit $D^{10}$, unit Q, unit M, and unit T.

The epoxy-group-containing polyorganosiloxane is preferably an epoxy-group-containing polydimethylsiloxane having an epoxy value of 0.1 to 5. The weight average molecular weight thereof is generally 1,500 to 500,000, but preferably 100,000 or lower, for the purpose of suppression of precipitation in the adhesive.

Specific examples of the epoxy-group-containing polyorganosiloxane include, but are not limited to, those represented by formulas (E1) to (E3):

[F2]

(E1)

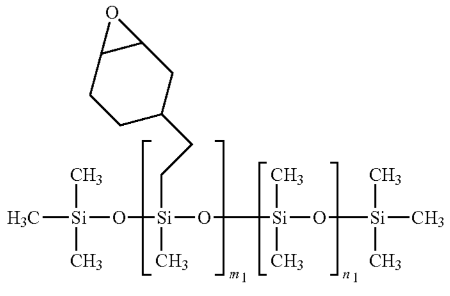

(wherein each of $m_1$ and $n_1$ represents the number of repeating units and is a positive integer);

[F2]

(E2)

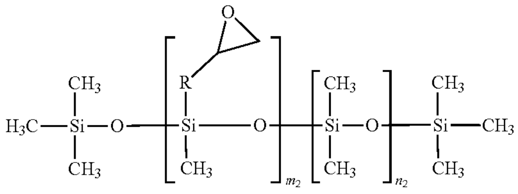

(wherein each of $m_2$ and $n_2$ represents the number of repeating units and is a positive integer, and R represents a C1 to C10 alkylene group); and

[F4]

(E3)

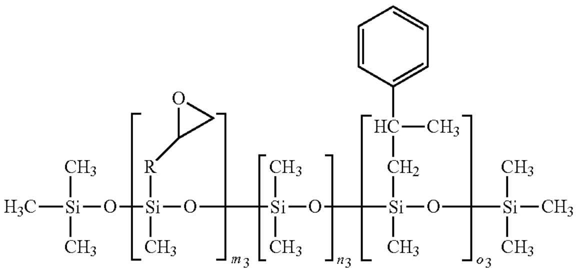

(wherein each of $m_3$, $n_3$ and $o_3$ represents the number of repeating units and is a positive integer, and R represents a C1 to C10 alkylene group).

The methyl-group-containing polyorganosiloxane includes, for example, a siloxane containing a siloxane unit represented by $R^{210}R^{220}SiO_{2/2}$ (unit $D^{200}$), preferably a siloxane containing a siloxane unit represented by $R^{21}R^{21}SiO_{2/2}$ (unit $D^{20}$).

Each of $R^{210}$ and $R^{220}$ is a group bonded to a silicon atom and represents an alkyl group. At least one of $R^{210}$ and $R^{220}$ is a methyl group. Specific examples of the alkyl group include those as exemplified above.

$R^{21}$ is a group bonded to a silicon atom and represents an alkyl group. Specific examples of the alkyl group include those as exemplified above. $R^{21}$ is preferably a methyl group.

In the present invention, examples of preferred methyl-group-containing polyorganosiloxanes include, but are not limited to, polydimethylsiloxane.

The methyl-group-containing polyorganosiloxane contains the aforementioned siloxane unit (unit $D^{200}$ or unit $D^{20}$), but may also contain the aforementioned unit Q, unit M and/or unit T, in addition to unit $D^{200}$ or unit $D^{20}$.

In one embodiment of the present invention, specific examples of the methyl-group-containing polyorganosiloxane include polyorganosiloxane formed only of unit $D^{200}$, polyorganosiloxane formed of unit $D^{200}$ and unit Q, polyorganosiloxane formed of unit $D^{200}$ and unit M, polyorganosiloxane formed of unit $D^{200}$ and unit T, polyorganosiloxane formed of unit $D^{200}$, unit Q, and unit M, polyorganosiloxane formed of unit $D^{200}$, unit M, and unit T, and polyorganosiloxane formed of unit $D^{200}$, unit Q, unit M, and unit T.

In one preferred embodiment of the present invention, specific examples of the methyl-group-containing polyorganosiloxane include polyorganosiloxane formed only of unit $D^{20}$, polyorganosiloxane formed of unit $D^{20}$ and unit Q, polyorganosiloxane formed of unit $D^{20}$ and unit M, polyorganosiloxane formed of unit $D^{20}$ and unit T, polyorganosiloxane formed of unit $D^{20}$, unit Q, and unit M, polyorganosiloxane formed of unit $D^{20}$, unit M, and unit T, and polyorganosiloxane formed of unit $D^{20}$, unit Q, unit M, and unit T.

Specific examples of the methyl-group-containing polyorganosiloxane include, but are not limited to, a polyorganosiloxane represented by formula (M1):

[F5]

(M1)

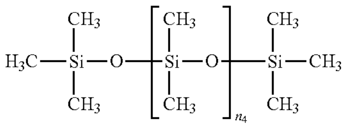

(wherein $n_4$ represents the number of repeating units and is a positive integer).

Examples of the phenyl-group-containing polyorganosiloxane include a siloxane containing a siloxane unit represented by $R^{31}R^{32}SiO_{2/2}$ (unit $D^{30}$).

$R^{31}$ is a group bonded to a silicon atom and represents a phenyl group or an alkyl group, and $R^{32}$ is a group bonded to a silicon atom and represents a phenyl group. Specific examples of the alkyl group include those as exemplified above. $R^{31}$ is preferably a methyl group.

The phenyl-group-containing polyorganosiloxane contains the aforementioned siloxane unit (unit $D^{30}$), but may also contain the aforementioned unit Q, unit M and/or unit T, in addition to unit $D^{30}$.

In one preferred embodiment of the present invention, specific examples of the phenyl-group-containing polyorganosiloxane include polyorganosiloxane formed only of unit $D^{30}$, polyorganosiloxane formed of unit $D^{30}$ and unit Q, polyorganosiloxane formed of unit $D^{30}$ and unit M, polyorganosiloxane formed of unit $D^{30}$ and unit T, polyorganosiloxane formed of unit $D^{30}$, unit Q, and unit M, polyorganosiloxane formed of unit $D^{30}$, unit M, and unit T, and polyorganosiloxane formed of unit $D^{30}$, unit Q, unit M, and unit T.

Specific examples of the phenyl-group-containing polyorganosiloxane include, but are not limited to, a polyorganosiloxane represented by formula (P1) or (P2):

[F6]

(P1)

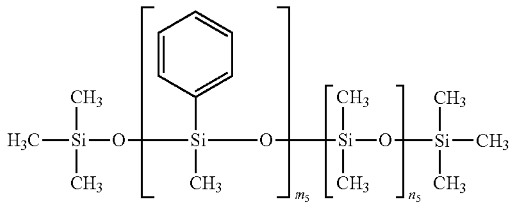

(wherein each of $m_5$ and $n_5$ represents the number of repeating units and is a positive integer); or

[F7]

(P2)

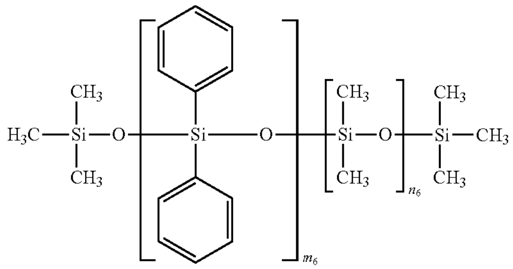

(wherein each of $m_6$ and $n_6$ represents the number of repeating units and is a positive integer).

The adhesive composition used in the present invention may contain the adhesive component (S) and the releasing agent component (B) at any ratio. In consideration of the balance between adhesiveness and peelability, the ratio by mass of component (S) to component (B) is preferably 99.995:0.005 to 30:70, more preferably 99.9:0.1 to 75:25.

In other words, when the adhesive composition contains the polyorganosiloxane component (A) which is curable through hydrosilylation, the ratio by mass of component (A) to component (B) is preferably 99.995:0.005 to 30:70, more preferably 99.9:0.1 to 75:25.

For the purpose of adjusting the viscosity or for other reasons, the adhesive composition used in the present invention may contain a solvent. Specific examples of the solvent include, but are not limited to, an aliphatic hydrocarbon, an aromatic hydrocarbon, and a ketone.

More specific examples of the solvent include, but are not limited to, hexane, heptane, octane, nonane, decane, undecane, dodecane, isododecane, menthane, limonene, toluene, xylene, mesitylene, cumene, MIBK (methyl isobutyl ketone), butyl acetate, diisobutyl ketone, 2-octanone, 2-nonanone, and 5-nonanone. These solvents may be used singly or in combination of two or more species.

In the case where the adhesive composition used in the present invention contains a solvent, the amount of the solvent content is appropriately adjusted in consideration of a target viscosity of the composition, the application method to be employed, the thickness of the formed thin film, etc. The solvent content of the entire adhesive composition is generally about 10 to about 90 mass %.

The viscosity (25° C.) of the adhesive composition used in the present invention is generally 500 to 20,000 mPa·s, preferably 1,000 to 5,000 mPa·s. In consideration of various factors such as the application method to be employed and the thickness of the formed thin film, the viscosity of the adhesive composition of the present invention may be adjusted by modifying the type and composition of the organic solvent employed, the film-forming component concentration, etc. Notably, as used herein, the term "film-forming component" refers to a component or components other than the solvent contained in the composition.

The adhesive composition used in the present invention may be produced by mixing the adhesive component (S) and a solvent with the releasing agent component (B) which is optionally used.

No particular limitation is imposed on the sequential order of mixing of these components. In one non-limitative example of the method which can easily produce the adhesive composition at high reproducibility, the adhesive component (S) and the releasing agent component (B) are dissolved in a solvent. In another non-limitative mode, a portion of a mixture of the adhesive component (S) and the releasing agent component (B) is dissolved in a solvent; the remaining portion of the mixture is dissolved in another solvent; and the resultant solutions are mixed together. Notably, the adhesive composition may be appropriately heated in the preparation thereof, so long as the components of the composition are not decomposed or denatured.

In the present invention, the solvent, solution, etc. used in relation to the production of the adhesive composition may be filtered for the purpose of removing foreign matter by means of, for example, a sub-micrometer filter in the course of producing the composition or after mixing of all the components.

The adhesive layer included in the laminate of the present invention generally has a thickness of 5 to 500 μm. From the viewpoint of securing film strength, the thickness is preferably 10 μm or more, more preferably 20 μm or more, still more preferably 30 m or more. From the viewpoint of avoiding inhomogeneity possibly due to a large film thickness, the thickness is preferably 200 μm or less, more preferably 150 μm or less, still more preferably 120 μm or less, much more preferably 70 μm or less.

The laminate of the present invention can be produced through, for example, a method including a first step of applying the releasing agent composition onto a surface of a semiconductor substrate and, if required, optionally heating the composition, to thereby form a releasing agent coating layer; a second step of applying the adhesive composition onto a surface of a support substrate and, if required, optionally heating the composition, to thereby form an adhesive coating layer; and a third step of bringing the releasing agent coating layer of the semiconductor substrate into close contact with the adhesive coating layer of the support substrate under application of a load in a thickness direction of the semiconductor substrate and the support substrate, while performing at least one of heat treatment and reduced pressure treatment, followed by performing post-heat treatment, to thereby produce a laminate.

Notably, so long as the effects of the present invention are not impaired, the respective compositions may be sequentially applied to and heated on either of the substrates.

No particular limitation is imposed on the application method, and spin coating is generally performed. In an alternative method, a coating film is separately formed through spin coating or a similar technique, and the sheet-form coating film is attached to serve as the adhesive coating layer or the releasing agent coating layer.

The temperature of heating the applied adhesive composition cannot unequivocally be determined, since the temperature varies depending on, for example, the type or amount of the adhesive component contained in the adhesive composition, the presence or absence of a solvent in the composition, the boiling point of the solvent used, or the target thickness of the adhesive layer. However, the heating temperature is generally 80° C. to 150° C., and the heating time is generally 30 seconds to 5 minutes.

When the adhesive composition contains a solvent, the applied adhesive composition is usually heated.

The temperature of heating the applied releasing agent composition cannot unequivocally be determined, since the temperature varies depending on, for example, the type or amount of the acid generator, the boiling point of the solvent used, the target thickness of the release layer. However, the temperature is 80° C. or higher from the viewpoint of forming a suitable release layer at high reproducibility, and the temperature is 300° C. or lower from the viewpoint of suppressing the decomposition of the acid generator. The heating time is appropriately determined in response to the heating temperature and is generally 10 seconds to 10 minutes.

When the releasing agent composition contains a solvent, the applied composition is usually heated.

The heating may be performed by means of a hot plate, an oven, or the like.

The thickness of the adhesive coating layer formed through application and heating of the adhesive composition is appropriately determined so that the thickness of the adhesive layer finally falls within the aforementioned range thereof.

The thickness of the releasing agent coating layer formed through application and heating of the releasing agent composition is appropriately determined so that the thickness of the release layer finally falls within the aforementioned range thereof.

The laminate of the present invention can be produced by bringing these coating layers into contact with each other, and closely binding these two layers under application of a load in a thickness direction of the semiconductor substrate and the support substrate while performing heat treatment or reduced pressure treatment or both of these treatments, followed by post-heat treatment. The choice of the heat treatment, the reduced pressure treatment, or both of these treatments in combination is determined in consideration of various factors, including the type of the adhesive composition and the target bonding strength.

Generally, the heat treatment is performed at a temperature appropriately selected from a range of 20 to 150° C., from the viewpoints of, for example, softening the adhesive coating layer to achieve suitable bonding to the releasing agent coating layer, and suitable curing of an adhesive which cannot be sufficiently cured at a temperature of heating for forming the adhesive coating layer. Particularly, the heat treatment is preferably performed at 130° C. or lower, more preferably at 90° C. or lower, from the viewpoint of suppressing or avoiding excessive curing or undesired denaturation of the adhesive component (S). The heating time is generally 30 seconds or longer, preferably 1 minute or longer, from the viewpoint of securing the adhesive performance, and is generally 10 minutes or shorter, preferably 5 minutes or shorter, from the viewpoint of suppressing denaturation of the adhesive layer or another member.

In the reduced pressure treatment, the adhesive coating layer and the releasing agent coating layer, being in contact with each other, are placed in an atmosphere at 10 Pa to 10,000 Pa. The time of the reduced pressure treatment is generally 1 to 30 minutes.

From the viewpoint of producing, at high reproducibility, a laminate whose substrate can be suitably removed, the adhesive coating layer and the releasing agent coating layer, being in contact with each other, are bonded together preferably through reduced-pressure treatment, more preferably through heating treatment in combination of reduced-pressure treatment.

No particular limitation is imposed on the load which is applied to the semiconductor substrate and the support substrate in a thickness direction, so long as the semiconductor substrate, the support substrate, and the two layers disposed therebetween are not damaged, and these elements are closely bound. The load is generally 10 to 1,000 N.

The temperature of post-heating is preferably 120° C. or higher from the viewpoint of, for example, attaining sufficient curing rate, and preferably 260° C. or lower from the viewpoint of, for example, preventing deterioration of the substrates and other component layers.

The post-heating time is generally 1 minute or longer, preferably 5 minutes or longer, from the viewpoint of achieving suitable joining of the substrates and layers forming the laminate. Also, the post-heating time is generally 180 minutes or shorter, preferably 120 minutes or shorter, from the viewpoint of preventing or avoiding, for example, an adverse effect on the component layers due to excessive heating.

Heating may be performed by means of a hot plate, an oven, or the like. In the case where the post-heating is performed by means of a hot plate, the laminate may be placed so that either the semiconductor substrate or the support substrate thereof is located at a lower position. However, from the viewpoint of achieving suitable debonding at high reproducibility, the semiconductor substrate is preferably located at a lower position.

Notably, one purpose of performing post-heating is to form an adhesive layer which is more preferably a self-standing film. Particularly when the adhesive composition contains a component which is curable through hydrosilylation, another purpose is to secure suitable curing.

The processed semiconductor substrate production method of the present invention includes a first step of processing the aforementioned semiconductor substrate of the laminate of the present invention.

In the first step, the processing performed with respect to the semiconductor substrate is, for example, processing of a back surface of a wafer (i.e., the surface opposite the circuit-furnished surface of the wafer), and typical examples of the processing include thinning a wafer by polishing (grinding) the backside thereof. Thereafter, the thinned wafer is provided with through silicon vias (TSVs) and the like and then removed from the support substrate. A plurality of such wafers are stacked to form a wafer laminate, to thereby complete 3-dimensional mounting. Before or after the above process, a backside electrode and the like are formed on the wafer. When thinning of a wafer and the TSV process are performed, a thermal load of 250 to 350° C. is unavoidably applied to the laminate bonded to the support. The laminate of the present invention including the adhesive layer and the release layer has heat resistance to the load.

In addition, in the laminate of the present invention, the aforementioned release layer is formed so as to be in contact with the semiconductor substrate. Thus, even when high temperature or pressure is applied to the laminate, damage (e.g., deformation) of bumps of the semiconductor substrate, which would otherwise be caused by such an external load, is suppressed. Such an advantageous property cannot be unequivocally defined, since it varies depending on the type and film thickness of the adhesive layer, the thickness of the release layer, etc. However, specifically, according to the laminate of the present invention, damage of the semiconductor substrate is reduced even under severe conditions: generally 200° C. or higher, 250° C. or higher in a preferred embodiment, 300° C. or higher in a more preferred embodiment, 350° C. or higher in a still more preferred embodiment, 350° C. or higher and a pressure of 60 $N/cm^2$ or higher in a yet more preferred embodiment, and 400° C. or higher and a pressure of 120 $N/cm^2$ or higher in a further more preferred embodiment.

Notably, the processing is not limited to the aforementioned process and may include, for example, a semiconductor element-mounting process of a substrate onto which the semiconductor element is to be mounted, wherein the substrate has been temporarily bonded to a support substrate for sustaining the workpiece substrate.

The processed semiconductor substrate production method of the present invention generally includes a second step of separating (peeling) the semiconductor substrate from the support substrate.

In the laminate of the present invention, the substrates and the adhesive layer are bonded by the mediation of the release layer in a debondable manner. Thus, no particular limitation is imposed on the method of separating (peeling) the semiconductor substrate from the support substrate, and non-limitative examples of the method include immersion in a solvent, debonding with laser light, mechanical debonding by means of a machine member having a sharp part, and peeling of the support from the target wafer.

Particularly, in the laminate of the present invention, the release layer is suitably formed. Thus, the laminate can be easily debonded at the interface between the release layer and the adhesive layer by immersing the laminate in an organic solvent. Typical examples of such organic solvents include linear-chain or branched-chain aliphatic hydrocarbons, for example, linear-chain or branched-chain saturated aliphatic hydrocarbons such as hexane, heptane, octane, nonane, decane, undecane, dodecane, and isododecane; alicyclic hydrocarbons, for example, saturated alicyclic hydrocarbons such as cyclohexane, cycloheptane, cyclooctane, isopropylcyclohexane, and p-menthane, and unsaturated alicyclic hydrocarbons such as limonene; aromatic hydrocarbons such as benzene, toluene, o-xylene, m-xylene, p-xylene, mesitylene, 1,2,4-trimethylbenzene, cumene, 1,4-diisopropylbenzene, and p-cymene; ketones, for example, saturated aliphatic hydrocarbon ketones, such as dialkyl ketones such as MIBK (methyl isobutyl ketone), ethyl methyl ketone, acetone, diisobutyl ketone, 2-octanone, 2-nonanone, and 5-nonanone, and cycloalkyl ketones such as cyclohexanone, and unsaturated aliphatic hydrocarbon ketones, such as alkenyl ketones such as isophorone; ethers, for example, dialkyl ethers such as diethyl ether, di(n-propyl) ether, di(n-butyl) ether, and di(n-pentyl) ether, and cyclic alkyl ethers such as tetrahydrofuran and dioxane; sulfides, for example, dialkyl sulfides such as diethyl sulfide, di(n-propyl) sulfide, and di(n-butyl) sulfide; and esters such as butyl acetate and pentyl acetate. These organic solvents may be used singly or in combination of two or more species.

When the support substrate has light transparency, the release layer or the adhesive layer is irradiated, from the support substrate side, with light required for evoking separation or decomposition of the release layer or the adhesive layer. Thereafter, the semiconductor substrate can be easily separated from the support substrate by pulling up any one of the substrates.

Light irradiation may be conducted by laser light or non-laser light from a light source (e.g., a lamp).

The processed semiconductor substrate production method of the present invention generally includes a third step of cleaning the separated semiconductor substrate. The cleaning for removing adhesive residue and releasing agent residue may be performed by spraying a cleaning agent composition onto the surface of the separated semiconductor substrate or by immersing the separated semiconductor substrate in a cleaning agent composition. Alternatively, cleaning may be performed by means of a remover tape and the like.

The aforementioned technical and methodological elements involved in the processed semiconductor substrate production method of the present invention may be modified in various manners, so long as the modification does not deviate from the gist of the present invention.

Needless to say, the processed semiconductor substrate production method of the present invention may further include an additional step other than the aforementioned steps.

The technical feature of the debonding method of the present invention resides in that the laminate of the present invention is immersed in an organic solvent, to thereby separate the semiconductor substrate from the support substrate.

EXAMPLES (1) Agitator: Planetary centrifugal mixer ARE-500 (product of Thinky Corporation)
(2) Rheometer: Rheometer MCR302 (product of Anton Paar Japan K.K.)
(3) Vacuum bonding apparatus: Manual Bonder (product of Suss MicroTec)
(4) Thermal pressure bonding apparatus: 8-Inch Manual Bonder (product of Suss MicroTec)

[1] Preparation of Adhesive Composition

Preparation Example 1

To a 600-mL agitation container dedicated for a planetary centrifugal mixer, there were added an MQ resin having a polysiloxane structure and vinyl groups (product of WACKER Chemie AG) (80 g), SiH-group-containing linear-chain polydimethylsiloxane (viscosity: 100 mPa·s) (product of WACKER Chemie AG) (2.52 g), SiH-group-containing linear-chain polydimethylsiloxane (viscosity: 70 mPa·s) (product of WACKER Chemie AG) (5.89 g), and 1-ethynyl-1-cyclohexanol (product of WACKER Chemie AG) (0.22 g). The obtained mixture was agitated by means of the agitator for 5 minutes.

Separately, a platinum catalyst (product of WACKER Chemie AG) (0.147 g) and vinyl-group-containing linear-chain polydimethylsiloxane (viscosity: 1,000 mPa·s) (product of WACKER Chemie AG) (5.81 g) were agitated by means of an agitator for 5 minutes, and a portion (3.96 g) of the mixture was added to the above mixture. The thus-combined mixture was agitated by means of an agitator for 5 minutes. Finally, the resultant mixture was filtered through a nylon filter (300 mesh), to thereby prepare an adhesive composition.

[2] Preparation of Releasing Agent Composition

Preparation Example 2-1

Polyorganosiloxane (polydimethylsiloxane having a viscosity of 5,000,000 mPa·s, GENIOPLAST GUM, product of WACKER Chemie AG) (50 g) and p-menthane (product of Nippon Terpene Chemicals, Inc.) (450 g) were added to a 600-mL agitation container dedicated for a planetary centrifugal mixer, and the mixture was agitated by means of the agitation apparatus for 5 minutes.

Finally, the resultant mixture was filtered through a nylon filter (300 mesh), to thereby prepare a releasing agent composition.

Preparation Example 2-2

Polyorganosiloxane (polydimethylsiloxane having a viscosity of 5,000,000 mPa·s, GENIOPLAST GUM, product of WACKER Chemie AG) (25 g), polyorganosiloxane (polydimethylsiloxane having a viscosity of 1,000,000 mPa·s, AK1000000, product of WACKER Chemie AG) (25 g), and p-menthane (product of Nippon Terpene Chemicals, Inc.) (450 g) were added to a 600-mL agitation container dedicated for a planetary centrifugal mixer, and the mixture was agitated by means of the agitation apparatus for 5 minutes.

Finally, the resultant mixture was filtered through a nylon filter (300 mesh), to thereby prepare a releasing agent composition.

Preparation Example 2-3

Polyorganosiloxane (polydimethylsiloxane having a viscosity of 1,000,000 mPa·s, AK1000000, product of WACKER Chemie AG) (50 g), and p-menthane (product of Nippon Terpene Chemicals, Inc.) (450 g) were added to a 600-mL agitation container dedicated for a planetary centrifugal mixer, and the mixture was agitated by means of the agitation apparatus for 5 minutes.

Finally, the resultant mixture was filtered through a nylon filter (300 mesh), to thereby prepare a releasing agent composition.

Preparation Example 2-4

Polyorganosiloxane (polydimethylsiloxane having a viscosity of 5,000,000 mPa·s, GENIOPLAST GUM, product of WACKER Chemie AG) (25 g), polyorganosiloxane (polydimethylsiloxane having a viscosity of 10,000 mPa·s, AK10000, product of WACKER Chemie AG) (25 g), and p-menthane (product of Nippon Terpene Chemicals, Inc.) (450 g) were added to a 600-mL agitation container dedicated for a planetary centrifugal mixer, and the mixture was agitated by means of the agitation apparatus for 5 minutes.

Finally, the resultant mixture was filtered through a nylon filter (300 mesh), to thereby prepare a releasing agent composition.

Preparation Example 2-5

Polyorganosiloxane (polydimethylsiloxane having a viscosity of 5,000,000 mPa·s, GENIOPLAST GUM, product of WACKER Chemie AG) (25 g), polyorganosiloxane (polydimethylsiloxane having a viscosity of 1,000 mPa·s, AK1000, product of WACKER Chemie AG) (25 g), and p-menthane (product of Nippon Terpene Chemicals, Inc.) (450 g) were added to a 600-mL agitation container dedicated for a planetary centrifugal mixer, and the mixture was agitated by means of the agitation apparatus for 5 minutes.

Finally, the resultant mixture was filtered through a nylon filter (300 mesh), to thereby prepare a releasing agent composition.

Preparation Example 2-6

Polyorganosiloxane (polydimethylsiloxane having a viscosity of 5,000,000 mPa·s, GENIOPLAST GUM, product of WACKER Chemie AG) (25 g), polyorganosiloxane (polydimethylsiloxane having a viscosity of 50 mPa·s, AK50, product of WACKER Chemie AG) (25 g), and p-menthane (product of Nippon Terpene Chemicals, Inc.) (450 g) were added to a 600-mL agitation container dedicated for a planetary centrifugal mixer, and the mixture was agitated by means of the agitation apparatus for 5 minutes.

Finally, the resultant mixture was filtered through a nylon filter (300 mesh), to thereby prepare a releasing agent composition.

Preparation Example 2-7

Polyorganosiloxane (polydimethylsiloxane having a viscosity of 5,000,000 mPa·s, GENIOPLAST GUM, product of WACKER Chemie AG) (25 g), polyorganosiloxane (polymethylphenylsiloxane having a viscosity of 30,000 mPa·s, PMM-1043, product of Gelest) (25 g), and p-menthane (product of Nippon Terpene Chemicals, Inc.) (450 g) were added to a 600-mL agitation container dedicated for a planetary centrifugal mixer, and the mixture was agitated by means of the agitation apparatus for 5 minutes.

Finally, the resultant mixture was filtered through a nylon filter (300 mesh), to thereby prepare a releasing agent composition.

Preparation Example 2-8

Polyorganosiloxane (polydimethylsiloxane having a viscosity of 5,000,000 mPa·s, GENIOPLAST GUM, product of WACKER Chemie AG) (25 g), polyorganosiloxane (polymethylphenylsiloxane having a viscosity of 500 mPa·s, PMM-1023, product of Gelest) (25 g), and p-menthane (product of Nippon Terpene Chemicals, Inc.) (450 g) were added to a 600-mL agitation container dedicated for a planetary centrifugal mixer, and the mixture was agitated by means of the agitation apparatus for 5 minutes.

Finally, the resultant mixture was filtered through a nylon filter (300 mesh), to thereby prepare a releasing agent composition.

[3] Measurement of Viscosity of Polyorganosiloxane Mixture (Polyorganosiloxane Component)

Preparation Examples 3-1 to 3-8

Firstly, the procedure of Preparation Examples 2-1 to 2-8 was repeated, except that p-menthane was not used, to thereby prepare corresponding polyorganosiloxane mixtures.

Each of the polyorganosiloxane mixtures was agitated overnight by means of a mix rotor placed in a thermostat bath at 45° C. Subsequently, the mixture was allowed to cool to room temperature, and agitated for a further 5 minutes by means of an agitator. Through such an agitation process, a well-mixed, uniform polyorganosiloxane mixture was yielded. The viscosity of each mixture was measured at 25° C. by means of a rheometer, whereby the viscosity of the corresponding polyorganosiloxane component (hereinafter may be abbreviated as "POS component") was calculated. Table 1 shows the results.

TABLE 1

| Preparation Example | Viscosity (Pa · s) |
|---|---|
| 3-1 | 5,573 |
| 3-2 | 3,473 |
| 3-3 | 1,277 |
| 3-4 | 1,023 |
| 3-5 | 893 |
| 3-6 | 705 |
| 3-7 | 1,225 |
| 3-8 | 741 |

[4] Fabrication of Substrate Samples

Production Example 1

A substrate (wafer) provided with bumps, serving as a device-side wafer (i.e., a semiconductor substrate), was cut to prepare substrate samples (4 cm×4 cm). Each substrate samples had 5,044 bumps. Each bump had a pillar formed of copper, a cap formed of tin-silver (Ag: 1.8 wt. %), and a portion between the pillar and the cap, the portion being formed of nickel.

Production Example 2

A silicon wafer, serving as a device-side wafer (i.e., a semiconductor substrate), was cut to prepare substrate samples (4 cm×4 cm).

[5] Fabrication of Laminate for Performance Evaluation

Comparative Example 1

The adhesive composition prepared in Preparation Example 1 was applied, through spin coating, onto the bump-provided surface of the substrate sample fabricated in Production Example 1, so that the thickness of the finally obtained coating layer in the laminate was adjusted to 60 μm. Thus, an adhesive coating layer was formed on the substrate sample serving as a semiconductor substrate.

Subsequently, the substrate sample (silicon wafer) and a 100-mm glass wafer (support substrate) were bonded together by means of a bonder, so that the adhesive coating layer was sandwiched between the two wafers. The thus-stacked body was post-heated by means of a hot plate at 200° C. for 10 minutes, while the substrate sample was in contact with the hot plate, to thereby complete a laminate. Notably, the bonding procedure was performed at 23° C. under a reduced pressure of 1,500 Pa.

Comparative Example 2

The releasing agent composition prepared in Preparation Example 2-1 was applied, through spin coating, onto the bump-provided surface of the substrate sample fabricated in Production Example 1, so that the thickness of the finally obtained coating layer in the laminate was adjusted to 2.50 μm. Then, the coated substrate sample was heated at 120° C. for 90 seconds, to thereby form a releasing agent coating layer on the substrate sample (semiconductor substrate).

Separately, the adhesive composition prepared in Preparation Example 1 was applied, through spin coating, onto a 100-mm glass wafer (EAGLE-XG, product of Corning, thickness: 500 μm, the same applies hereinafter), so that the thickness of the finally obtained coating layer in the laminate was adjusted to 60 μm. Thus, an adhesive coating layer was formed on the glass wafer serving as a support substrate.

Subsequently, the substrate sample (silicon wafer) and the glass wafer were bonded together by means of a bonder, so that the releasing agent coating layer and the adhesive coating layer were sandwiched between the two wafers. The thus-stacked body was post-heated by means of a hot plate at 200° C. for 10 minutes, while the substrate sample was in contact with the hot plate, to thereby complete a laminate. Notably, the bonding procedure was performed at 23° C. under a reduced pressure of 1,500 Pa.

Examples 1 to 4 and Comparative Example 3

The procedure of Comparative Example 2 was repeated, except that the releasing agent compositions produced in Preparation Examples 2-2 to 2-6 were used instead of the releasing agent composition produced in Preparation Example 2-1, to thereby fabricate respective laminates.

Examples 5 to 8 and Comparative Example 4

The procedure of Example 1 was repeated, except that the thickness of the release layer was changed to 0.50 μm, 1.00 μm, 1.50 μm, 2.00 μm, and 5.00 μm, to thereby fabricate respective laminates.

Comparative Examples 5 and 6

The procedure of Comparative Example 2 was repeated, except that the releasing agent compositions produced in Preparation Examples 2-7 and 2-8 were used instead of the releasing agent composition produced in Preparation Example 2-1, to thereby fabricate respective laminates.

[6] High-Temperature, Pressure Treatment of Laminate

Each of the laminates was fabricated in Examples 1 to 5 and Comparative Examples 1 to 4 was subjected to a high temperature, pressure treatment by means of a thermal pressurizing apparatus. The high temperature, pressure treatment was performed through the following procedure.

Specifically, the relevant laminate was placed on a stage maintained at 70° C., such that the support substrate of the laminate was in contact with the stage. The laminate was heated at 420° C. and 120 N/cm$^2$ for 8 seconds, while a pressure was applied from the semiconductor substrate side toward the direction vertical to the semiconductor substrate and the support substrate.

After the treatment, the state of the semiconductor substrate of the laminate was observed through the glass substrate (i.e., support substrate) under an optical microscope, and presence of deformation of bumps was visually checked. Also, after the observation, some of the laminates were evaluated for whether they were debondable (i.e., the bump-provided substrate was manually removable from the laminate). Tables 2 and 3 show the results.

TABLE 2

| | Film thickness (μm) | Viscosity of POS component (Pa · s) | Bump deformation | Peeling |
|---|---|---|---|---|
| Comp. Ex. 1 | — | — | yes | failure |
| Comp. Ex. 2 | 2.50 | 5,573 | yes | — |
| Ex. 1 | 2.50 | 3,473 | no | possible |
| Ex. 2 | 2.50 | 1,277 | no | possible |
| Ex. 3 | 2.50 | 1,023 | no | possible |
| Ex. 4 | 2.50 | 893 | no | — |
| Comp. Ex. 3 | 2.50 | 705 | yes | failure |

TABLE 3

| | Film thickness (μm) | Viscosity of POS component (Pa · s) | Bump deformation | Peeling |
|---|---|---|---|---|
| Ex. 5 | 050 | 3,473 | no | — |
| Ex. 1 | 2.50 | 3,473 | no | possible |
| Comp. Ex. 4 | 5.00 | 3,473 | yes | — |

As shown in Tables 2 and 3, in the laminates each having the release layer which had been produced from the releasing agent composition containing a polyorganosiloxane component comprising polydimethylsiloxane, which component had a viscosity falling within the range as specified by the present invention and which layer had a thickness falling within the range as specified by the present invention, deformation of bumps, which would otherwise be caused by high-temperature, pressure treatment, was successfully suppressed. Also, in the laminates of Examples 1 to 3, the support substrate was easily removed from the laminate by simply pulling the support substrate by hand, even after the high-temperature, pressure treatment. Thus, the semiconductor substrate was found to be easily separated from the support substrate.

In contrast, as shown in Table 2, in the laminates each having the release layer which had been produced from the releasing agent composition containing a polyorganosiloxane component comprising polydimethylsiloxane, which component had a viscosity falling outside the specific range as specified by the present invention, deformation of bumps failed to be successfully suppressed, even though the film had a specific film thickness falling within the range as specified by the present invention.

Also, as shown in Table 3, in the laminates each having the release layer having a thickness falling outside the range as specified by the present invention, deformation of bumps failed to be successfully suppressed, even though the film had been produced from the releasing agent composition containing a polyorganosiloxane component comprising polydimethylsiloxane, which component had a viscosity falling within the range as specified by the present invention.

As described in relation to the experimental results, the release layer was found to be essential for suppressing deformation of bumps, which layer is produced from a polyorganosiloxane component comprising polydimethylsiloxane which component has a viscosity falling within the range as specified by the present invention and which layer has a thickness falling within the range as specified by the present invention.

[7] High-Temperature Treatment of Laminate

By means of a hot plate, each of the laminates produced in Examples 1, 5 to 8 and Comparative Examples 4 to 6 was subjected to a high-temperature treatment. The specific procedure was as follows.

Firstly, the laminate was placed on the hot plate maintained at 280° C., while the support substrate of the laminate was in contact with the hot plate. The laminate was heated for 5 minutes.

After the treatment, the state of the semiconductor substrate of the laminate was observed through the glass substrate (i.e., support substrate) under an optical microscope, and presence of deformation of bumps was visually checked. Also, after the observation, some of the laminates were evaluated for whether the bump-provided substrate was removable from the laminate. Tables 4 and 5 show the results.

TABLE 4

| | Film thickness (μm) | Viscosity of POS component (Pa · s) | Bump deformation | Peeling |
|---|---|---|---|---|
| Ex. 5 | 0.50 | 3,473 | no | — |
| Ex. 6 | 1.00 | 3,473 | no | |
| Ex. 7 | 1.50 | 3,473 | no | |
| Ex. 8 | 2.00 | 3,473 | no | possible |
| Ex. 1 | 2.50 | 3,473 | no | possible |
| Comp. Ex. 4 | 5.00 | 3,473 | yes | — |

TABLE 5

| | Film thickness (μm) | Viscosity of POS component (Pa · s) | Bump deformation | Peeling |
|---|---|---|---|---|
| Ex. 1 | 2.50 | 3,473 | no | possible |
| Comp. Ex. 5 | 2.50 | 1,225 | yes | — |
| Comp. Ex. 6 | 2.50 | 741 | yes | — |

As shown in Table 4, in the laminates each including a release layer having a film thickness falling outside the specific range as specified by the present invention, deformation of bumps was not suppressed after heat treatment, although the film (release layer) was formed from a releasing agent composition containing polyorganosiloxane component which comprised polydimethylsiloxane and which had a viscosity falling within the specific range as specified by the present invention. In contrast, in the laminate including a release layer (i.e., the film having a film thickness falling within the specific range as specified by the present invention) formed from a releasing agent composition containing polyorganosiloxane component which comprised polydimethylsiloxane and which had a viscosity falling within the specific range as specified by the present invention, deformation of bumps, which would otherwise be caused by heat treatment, was successfully suppressed. Also, in the laminates of Examples 1 and 8, the support substrate was easily separated from the laminate by simply pulling the support layer by hand, even after the heat treatment. Thus, according to the present invention, separation of the semiconductor substrate from the support substrate was found to be easy.

As shown in Table 5, in the laminates each including a release layer formed from a releasing agent composition containing polyorganosiloxane component which comprised polydimethylsiloxane and polymethylphenylsiloxane, deformation of bumps was not suppressed after heat treatment.

Thus, the above experiments have revealed that a release layer (i.e., the film having a film thickness falling within the specific range as specified by the present invention) formed from a releasing agent composition containing polyorganosiloxane component which comprised polydimethylsiloxane and which had a viscosity falling within the scope of the present invention is required to suppress deformation of bumps.

[8] Checking of Debondability by Solvent

Comparative Referential Example 1

A substrate sample having an adhesive layer was fabricated. Specifically, the adhesive composition obtained in Preparation Example 1 was applied, through spin coating, onto the substrate sample produced in Production Example 2, so that the thickness of the finally formed film was adjusted to 60 μm, to thereby form an adhesive coating layer. The thus-coated substrate sample was heated by means of a hot plate at 200° C. for 10 minutes, while the substrate was in contact with the hot plate. The thus-fabricated substrate sample was immersed in p-menthane (9 mL), and the time required for starting the peeling of the adhesive layer was measured. Notably, when no peeling was observed within 5 minutes from the start of immersion, the case was assessed as "no peeling" (the same applies hereinafter).

Referential Example 1

A substrate sample having an adhesive layer and a release layer was fabricated. Specifically, the releasing agent composition obtained in Preparation Example 2-2 was applied, through spin coating, onto the substrate sample produced in Production Example 2, so that the thickness of the finally formed film was adjusted to 2.50 μm, to thereby form a releasing agent coating layer. Subsequently, the adhesive composition obtained in Preparation Example 1 was applied, through spin coating, onto the releasing agent coating layer, so that the thickness of the finally formed film was adjusted to 60 μm, to thereby form an adhesive coating layer. The obtained substrate sample having the two coating layers was heated by means of a hot plate at 200° C. for 10 minutes, while the substrate was in contact with the hot plate. The thus-fabricated substrate sample was immersed in p-menthane (9 mL), and the time required for starting the peeling of the adhesive layer was measured.

Table 6 collectively shows the results. As shown in Table 6, the adhesive layer formed on the release layer obtained from the releasing agent composition of the present invention was found to be favorably peeled through immersion in an organic solvent.

TABLE 6

| | Film thickness (μm) | Viscosity of POS component (Pa · s) | Time to peeling (s) |
|---|---|---|---|
| Comp. Ref. Ex. 1 | — | — | no peeling |
| Ref. Ex. 1 | 2.50 | 3,473 | 15 |

The invention claimed is:

1. A laminate comprising a semiconductor substrate, a support substrate, a release layer disposed so as to come into contact with the semiconductor substrate, and an adhesive layer disposed between the support substrate and the release layer, wherein:

the release layer is a thermoplastic film formed from a releasing agent composition containing a polyorganosiloxane component comprising polydimethylsiloxane represented by formula (X):

(X)

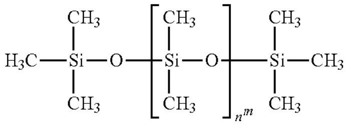

where n''' is a positive integer and represents the number of repeating units;

the polyorganosiloxane component has a viscosity of $5.50\times10^3$ Pa·s to $0.75\times10^3$ Pa·s, as measured at 25° C.; and the film has a thickness of 0.01 μm to 4.90 μm.

2. The laminate according to claim 1, wherein the viscosity of the polyorganosiloxane component is $5.00\times10^3$ Pa·s to $0.80\times10^3$ Pa·s, as measured at 25° C.

3. The laminate according to claim 2, wherein the viscosity of the polyorganosiloxane component is $4.52\times10^3$ Pa·s to $0.96\times10^3$ Pa·s, as measured at 25° C.

4. The laminate according to claim 1, wherein the thickness of the film is 0.25 μm to 3.75 μm.

5. The laminate according to claim 4, wherein the thickness of the film is 1.75 μm to 2.75 μm.

6. The laminate according to claim 1, wherein the adhesive layer is disposed so as to come into contact with the support substrate and the release layer.

7. The laminate according to claim 1, wherein the adhesive layer is a film formed from an adhesive composition containing an adhesive component (S) containing at least one species selected from among a polyorganosiloxane adhesive, an acrylic resin adhesive, an epoxy resin adhesive, a polyamide adhesive, a polystyrene adhesive, a polyimide adhesive, and a phenolic resin adhesive.

8. The laminate according to claim 7, wherein the adhesive component (S) contains a polyorganosiloxane adhesive.

9. The laminate according to claim 8, wherein the polyorganosiloxane adhesive contains a polyorganosiloxane component (A) which is curable through hydrosilylation.

10. A releasing agent composition for forming a release layer included in a laminate, the laminate comprising a semiconductor substrate, a support substrate, the release layer disposed so as to come into contact with the semiconductor substrate, and an adhesive layer disposed between the support substrate and the release layer, and the release layer being a thermoplastic film having a thickness of 0.01 μm to 4.90 μm, wherein the composition contains a polyorganosiloxane component comprising polydimethylsiloxane represented by formula (X):

(X)

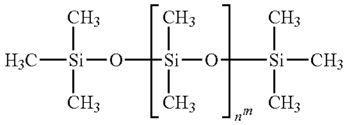

where n''' is a positive integer and represents the number of repeating units, and the polyorganosiloxane component has a viscosity of $5.50\times10^3$ Pa·s to $0.75\times10^3$ Pa·s, as measured at 25° C.

11. The releasing agent composition according to claim 10, wherein the viscosity of the polyorganosiloxane component is $5.00\times10^3$ Pa·s to $0.80\times10^3$ Pa·s, as measured at 25° C.

12. The releasing agent composition according to claim 11, wherein the viscosity of the polyorganosiloxane component is $4.52\times10^3$ Pa·s to $0.96\times10^3$ Pa·s, as measured at 25° C.

13. The releasing agent composition according to claim 10, wherein the thickness of the film is 0.25 μm to 3.75 μm.

14. The releasing agent composition according to claim 13, wherein the thickness of the film is 1.75 μm to 2.75 μm.

15. The releasing agent composition according to claim 10, wherein the adhesive layer is disposed so as to come into contact with the support substrate and the release layer.

16. The releasing agent composition according to claim 10, wherein the adhesive layer is a film formed from an adhesive composition containing an adhesive component (S) containing at least one species selected from among a polyorganosiloxane adhesive, an acrylic resin adhesive, an epoxy resin adhesive, a polyamide adhesive, a polystyrene adhesive, a polyimide adhesive, and a phenolic resin adhesive.

17. The releasing agent composition according to claim 16, wherein the adhesive component (S) contains a polyorganosiloxane adhesive.

18. The releasing agent composition according to claim 17, wherein the polyorganosiloxane adhesive contains a polyorganosiloxane component (A) which is curable through hydrosilylation.

* * * * *